United States Patent
Borean et al.

(10) Patent No.: US 10,333,304 B2
(45) Date of Patent: Jun. 25, 2019

(54) AUTOMATIC SYSTEM FOR MONITORING ELECTRIC POWER CONSUMPTION

(71) Applicant: TELECOM ITALIA S.p.A., Milan (IT)

(72) Inventors: Claudio Borean, Turin (IT); Ennio Grasso, Turin (IT)

(73) Assignee: TELECOM ITALIA S.p.A., Milan (IT)

( * ) Notice: Subject to any disclaimer, the term of this patent is extended or adjusted under 35 U.S.C. 154(b) by 226 days.

(21) Appl. No.: 15/525,621

(22) PCT Filed: Nov. 18, 2014

(86) PCT No.: PCT/EP2014/074888
§ 371 (c)(1),
(2) Date: May 10, 2017

(87) PCT Pub. No.: WO2016/078695
PCT Pub. Date: May 26, 2016

(65) Prior Publication Data
US 2018/0294647 A1   Oct. 11, 2018

(51) Int. Cl.
*H02J 3/14* (2006.01)
*H04L 29/08* (2006.01)
(Continued)

(52) U.S. Cl.
CPC ............. *H02J 3/14* (2013.01); *G01D 4/00* (2013.01); *G05B 15/02* (2013.01); *G05B 19/042* (2013.01);
(Continued)

(58) Field of Classification Search
CPC .... H02J 3/14; H02J 13/0017; H02J 2003/143; G01D 4/00; G05B 15/02; G05B 19/042;
(Continued)

(56) References Cited

U.S. PATENT DOCUMENTS

2012/0323390 A1    12/2012    Kobayasi
2013/0144451 A1*   6/2013    Kumar .................. G05B 13/02
                                                                700/291
(Continued)

FOREIGN PATENT DOCUMENTS

EP    2 533 395 A2    12/2012

OTHER PUBLICATIONS

International Search Report and Written Opinion dated Mar. 27, 2015, in PCT/EP2014/074888, filed Nov. 18, 2014.
(Continued)

*Primary Examiner* — Thomas C Lee
*Assistant Examiner* — Anzuman Sharmin
(74) *Attorney, Agent, or Firm* — Oblon, McClelland, Maier & Neustadt, L.L.P.

(57) ABSTRACT

A system for managing devices supplied through a power grid is proposed. Each device is configured to consume over time electric power according to at least one respective power profile when operating. The system comprises at least one unit interfaced with the devices for exchanging data. The at least one unit collects power profile data indicative of the power profiles of the devices, and generates a time schedule of the device operations by distributing over time start times of the power profiles in such a way that at any time the total power consumption of the devices is kept under a maximum power threshold of the power grid.

20 Claims, 7 Drawing Sheets

(51) Int. Cl.

| | | |
|---|---|---|
| *G01D 4/00* | (2006.01) | |
| *G06Q 50/06* | (2012.01) | |
| *G05B 15/02* | (2006.01) | |
| *G05B 19/042* | (2006.01) | |
| *G06N 7/00* | (2006.01) | |
| *H02J 13/00* | (2006.01) | |
| *G06N 3/00* | (2006.01) | |
| *G01R 22/06* | (2006.01) | |

(52) U.S. Cl.
CPC ............. *G06N 3/006* (2013.01); *G06N 7/005* (2013.01); *G06Q 50/06* (2013.01); *H02J 13/0017* (2013.01); *H04L 67/125* (2013.01); *G01R 22/063* (2013.01); *G05B 2219/2639* (2013.01); *G05B 2219/2642* (2013.01); *H02J 2003/143* (2013.01); *Y02B 70/3225* (2013.01); *Y02B 70/3241* (2013.01); *Y02B 70/3266* (2013.01); *Y02B 90/245* (2013.01); *Y04S 20/222* (2013.01); *Y04S 20/227* (2013.01); *Y04S 20/242* (2013.01); *Y04S 20/40* (2013.01); *Y04S 40/18* (2018.05)

(58) Field of Classification Search
CPC .... G05B 2219/2639; G05B 2219/2642; G06N 3/006; G06N 7/005; G06Q 50/06; H04L 67/125; Y04S 40/18; Y04S 20/222; Y04S 20/227; Y04S 20/242; Y04S 20/40; G01R 22/063; Y02B 70/3225; Y02B 70/3241; Y02B 70/3266; Y02B 90/245

See application file for complete search history.

(56) References Cited

U.S. PATENT DOCUMENTS

| | | | |
|---|---|---|---|
| 2013/0274940 A1* | 10/2013 | Wei ................... | G05B 19/02 700/291 |
| 2014/0010422 A1* | 1/2014 | Piper .................. | G06T 7/33 382/128 |
| 2014/0277599 A1* | 9/2014 | Pande ................ | G06Q 50/06 700/22 |
| 2014/0350743 A1* | 11/2014 | Asghari ............. | G05B 13/048 700/297 |
| 2015/0084432 A1* | 3/2015 | Yamazaki .......... | H02J 3/24 307/112 |

OTHER PUBLICATIONS

Alrashidi et al., "Long term electric load forecasting based on particle swarm optimization", Applied Energy, vol. 87, No. 1, XP026668178, 2010, p. 320-326.

\* cited by examiner

AUTOMATIC SYSTEM FOR MONITORING ELECTRIC POWER CONSUMPTION

BACKGROUND OF THE INVENTION

Field of the Invention

The present invention relates to a system and a method for monitoring and controlling the electric power consumption of devices supplied by the power line.

Description of the Related Art

Nowadays, the management of the electric power consumption has become a very complex issue, both in domestic and industrial scenarios.

Making reference to domestic scenarios, domestic electric power consumption is highly variable. Typically, during a working day, highest electric power consumptions mainly occur during morning and evening, while during weekends electric power consumption is more evenly distributed. Other factors may strongly influence the domestic power consumption, such as for example the holidays and seasons of the year. Moreover, if on the one hand the domestic electric power demand has reached higher and higher peak levels, on the other hand environmental and economic reasons have brought to the diffusion of residential renewable electric power generation units, whose electric power generation capabilities fluctuates based on the weather conditions. The complexity of this scenario is further increased by the introduction of time-varying and dynamic electric power tariffs.

Similar considerations may be applied to industrial scenarios.

In order to efficiently manage the electric power consumption so as to avoid overloads (i.e., to avoid that the maximum power threshold of the power grid is exceeded) and reduce the costs, all the abovementioned aspects should be taken into account. Since this is a very complex task, the introduction of a system capable of automatically managing the power consumptions is strongly desirable.

International patent application WO2009/097400 discloses a system and a method for monitoring and controlling the power consumption of a power-consuming device. The system and method may connect to a power source and a power-consuming device, connecting the power-consuming device to the power source. The power usage of the power-consuming device may then be measured and monitored. This monitoring data may then be stored and optionally sent to a controlling device on a data network. The location of the power-consuming device may also be determined, recorded, and sent to a controlling device. The system may also control the power usage of the power-consuming device. In some cases, a remote server may connect multiple energy monitoring systems in order to gain additional efficiencies and foster a community-based social network.

In the paper "Scheduling energy consumption with local renewable micro-generation and dynamic electricity prices" by Onur Derin and Alberto Ferrante, GREEMBED 2010, a scheduling problem for household tasks is discussed, directed to help users save money spent on their energy consumption. A system model is presented, which relies on electricity price signals, availability of locally-generated power and flexible tasks with deadlines. A case study shows that cost savings are possible but fast and efficient solutions to the scheduling problem are needed for their real world use.

SUMMARY OF THE INVENTION

The Applicant has found that the above mentioned solutions known in the art are affected by drawbacks, and/or are not efficient.

The system disclosed in patent application WO2009/097400 does not provide for automatically optimizing the electric power consumption. Moreover, the system of WO2009/097400 is not designed to prevent overloads.

The optimization method disclosed in the paper by Onur Derin and Alberto Ferrante is based on a brute-force approach, which involves the processing of a very large amount of data. Therefore, this method has to be carried out by hardware units provided with high computational resources. In any case, a method based on a brute-force approach such as the one proposed by Onur Derin and Alberto Ferrante requires a high amount of time to provide satisfactory results, and thus it is scarcely suitable to be used in dynamic scenarios, such as the management of domestic electric power consumption.

In view of the state of the art outlined in the foregoing, the Applicant has faced the problem of how to provide a system and a method for monitoring the electric power consumption of devices supplied by the power line in order to prevent the occurrences of overloads in a relatively short time, without requiring high computational resources.

Applicant has found that said problem may be solved by updating a time schedule scheduling start time of power profiles of devices based on a swarm optimization approach. The particles of the swarm are of two different types, each one following a different movement strategy according to a respective different type of random walk: the particles of the first type are configured to patrol over relatively long distances within the search space following a random walk based on a stable probability distribution having infinite variance, while the particles of the second type are configured to remain close to their current positions, following a random walk based on probability distribution having a finite variance.

An aspect of the present invention provides for a system for managing devices supplied through a power grid. Each device is configured to consume over time electric power according to at least one respective power profile when operating. The system comprises at least one unit interfaced with the devices for exchanging data. The at least one unit is configured to collect power profile data indicative of the power profiles of said devices, and generate a time schedule of the device operations by distributing over time start times of the power profiles in such a way that at any time the total power consumption of the devices is kept under a maximum power threshold of the power grid. The at least one unit is configured to generate said time schedule through a particle swarm optimization approach by:

a) randomly generating a population of candidate time schedules within a search space comprising a set of the possible candidate time schedules;

b) subdividing the population of candidate time schedules in a first group of candidate time schedules and in a second group of candidate time schedules;

c) performing phases d) and e) at least once;

d) moving the candidate time schedules of the first group in the search space following a random walk based on a stable probability distribution having an infinite variance;

e) moving the candidate time schedules of the second group in the search space following a random walk based on a probability distribution having a finite variance;

f) selecting a candidate time schedule based on a cost of said candidate time schedule corresponding to its position in the search space calculated by means of a cost function.

According to an embodiment of the present invention, said random walk based on a stable probability distribution having an infinite variance is a random walk based on a Lévy probability distribution, and said random walk based on a probability distribution having a finite variance is a uniform random walk.

According to an embodiment of the present invention, the at least one unit is further configured to:
for each candidate time schedule of the first and the second groups, moving said candidate time schedule by:
a) calculating a corresponding new position in the search space for said candidate time schedule,
b) moving said candidate time schedule to the corresponding new position conditioned to a comparison between a cost of said candidate time schedule corresponding to the current position in the search space calculated by means of the cost function and a cost of said candidate time schedule corresponding to the new position in the search space calculated by means of the cost function.

According to an embodiment of the present invention, the at least one unit is further configured to select a candidate time schedule best position in the search space among positions previously taken by all the candidate time schedules in the search space based on the cost thereof, and move each candidate time schedule by:
if the candidate time schedule belongs to the first group, calculating said corresponding new position based on a first difference between the best position and the current position of the candidate time schedule;
if the candidate time schedule belongs to the second group, calculating said corresponding new position based on a second difference between the current positions of two random candidate time schedules of the population.

According to an embodiment of the present invention, the at least one unit is further configured to move each candidate time schedule by:
if the candidate time schedule belongs to the first group, calculating said corresponding new position by varying the current position thereof by a first term based on a product between said first difference and a random number with Lévy distribution;
if the candidate time schedule belongs to the second group, calculating said corresponding new position by varying the current position thereof by a second term based on a product between said second difference and a random number with a uniform distribution.

According to an embodiment of the present invention, the at least one unit is further configured to move said candidate time schedule to the corresponding new position if the cost of the candidate time schedule corresponding to the current position is higher than the cost of the candidate time schedule corresponding to the new position.

According to an embodiment of the present invention, the at least one unit is further configured to move said candidate time schedule to the corresponding new position when the cost of the candidate time schedule corresponding to the current position is lower than the cost of the candidate time schedule corresponding to the new position conditioned to a parameter corresponding to a ratio of a third term and a fourth term The third term corresponds to the difference between the cost of the candidate time schedule corresponding to the new position and the cost of the candidate time schedule in the candidate time schedule best position. The fourth term corresponds to the distance between the new position and the candidate time schedule best position.

According to an embodiment of the present invention, the cost function of a candidate time schedule depends on the difference between the maximum power threshold of the power grid and a power consumption of the devices that would occur if the devices operated following the candidate time schedule.

According to an embodiment of the present invention, the at least one unit comprises a control unit configured to automatically control the operation of the devices based on the time schedule.

According to an embodiment of the present invention, the at least one unit comprises a user equipment configured to allow a user to view details of the time schedule.

Another aspect of the present invention provides for a method for managing devices supplied through a power grid. Each device is configured to consume over time electric power according to at least one respective power profile when operating. The method comprises collecting power profile data indicative of the power profiles of said devices, and generating a time schedule of the device operations by distributing over time start times of the power profiles in such a way that at any time the total power consumption of the devices is kept under a maximum power threshold of the power grid. Said generating a time schedule comprises generating said time schedule through a swarm optimization approach by performing the following phases:
a) randomly generating a population of candidate time schedules within a search space comprising a set of the possible candidate time schedules;
b) subdividing the population of candidate time schedules in a first group of candidate time schedules and in a second group of candidate time schedules;
c) performing phases d) and e) at least once;
d) moving the candidate time schedules of the first group in the search space following a random walk based on a stable probability distribution having an infinite variance;
e) moving the candidate time schedules of the second group in the search space following a random walk based on a probability distribution having a finite variance;
f) selecting a candidate time schedule based on a cost of said candidate time schedule corresponding to its position in the search space calculated by means of a cost function.

According to an embodiment of the present invention, said random walk based on a stable probability distribution having an infinite variance is a random walk based on a Lévy probability distribution, and said random walk based on a probability distribution having a finite variance is a uniform random walk.

According to an embodiment of the present invention, the method further comprises for each candidate time schedule of the first and the second groups, moving said candidate time schedule by:
a) calculating a corresponding new position in the search space for said candidate time schedule,
b) moving said candidate time schedule to the corresponding new position conditioned to a comparison between a cost of said candidate time schedule corresponding to the current position in the search space calculated by means of the cost function and a cost of said candidate time schedule corresponding to the new position in the search space calculated by means of the cost function.

According to an embodiment of the present invention, the method further comprises:

selecting a candidate time schedule best position in the search space among positions previously taken by all the candidate time schedules in the search space based on the cost thereof, and moving each candidate time schedule by:

if the candidate time schedule belongs to the first group, calculating said corresponding new position based on a first difference between the best position and the current position of the candidate time schedule;

if the candidate time schedule belongs to the second group, calculating said corresponding new position based on a second difference between the current positions of two random candidate time schedules of the population.

According to an embodiment of the present invention, the phase of moving each candidate time schedule comprises:

if the candidate time schedule belongs to the first group, calculating said corresponding new position by varying the current position thereof by a first term based on a product between said first difference and a random number with Lévy distribution;

if the candidate time schedule belongs to the second group, calculating said corresponding new position by varying the current position thereof by a second term based on a product between said second difference and a random number with a uniform distribution.

According to an embodiment of the present invention, the method further comprises moving said candidate time schedule to the corresponding new position if the cost of the candidate time schedule corresponding to the current position is higher than the cost of the candidate time schedule corresponding to the new position.

According to an embodiment of the present invention, the method further comprised moving said candidate time schedule to the corresponding new position when the cost of the candidate time schedule corresponding to the current position is lower than the cost of the candidate time schedule corresponding to the new position conditioned to a parameter corresponding to a ratio of a third term and a fourth term. The third term correspond to the difference between the cost of the candidate time schedule corresponding to the new position and the cost of the candidate time schedule in the candidate time schedule best position. The fourth term corresponds to the distance between the new position and the candidate time schedule best position.

According to an embodiment of the present invention, the cost function of a candidate time schedule depends on the difference between the maximum power threshold of the power grid and a power consumption of the devices that would occur if the devices operated following the candidate time schedule.

According to an embodiment of the present invention, the method further comprises automatically controlling the operation of the devices based on the time schedule.

According to an embodiment of the present invention, the method further comprises providing a user with details of the time schedule.

BRIEF DESCRIPTION OF THE DRAWINGS

These and other features and advantages of the present invention will be made evident by the following description of some exemplary and non-limitative embodiments thereof, to be read in conjunction with the attached drawings, wherein.

DETAILED DESCRIPTION OF EXEMPLARY EMBODIMENTS OF THE INVENTION

The present invention relates to systems for monitoring the electric power consumption of devices supplied by the power line provided by the power grid in domestic areas, commercial areas, districts, and/or industrial areas, and for controlling said devices according to the monitored electric power consumption.

Figure 1A:
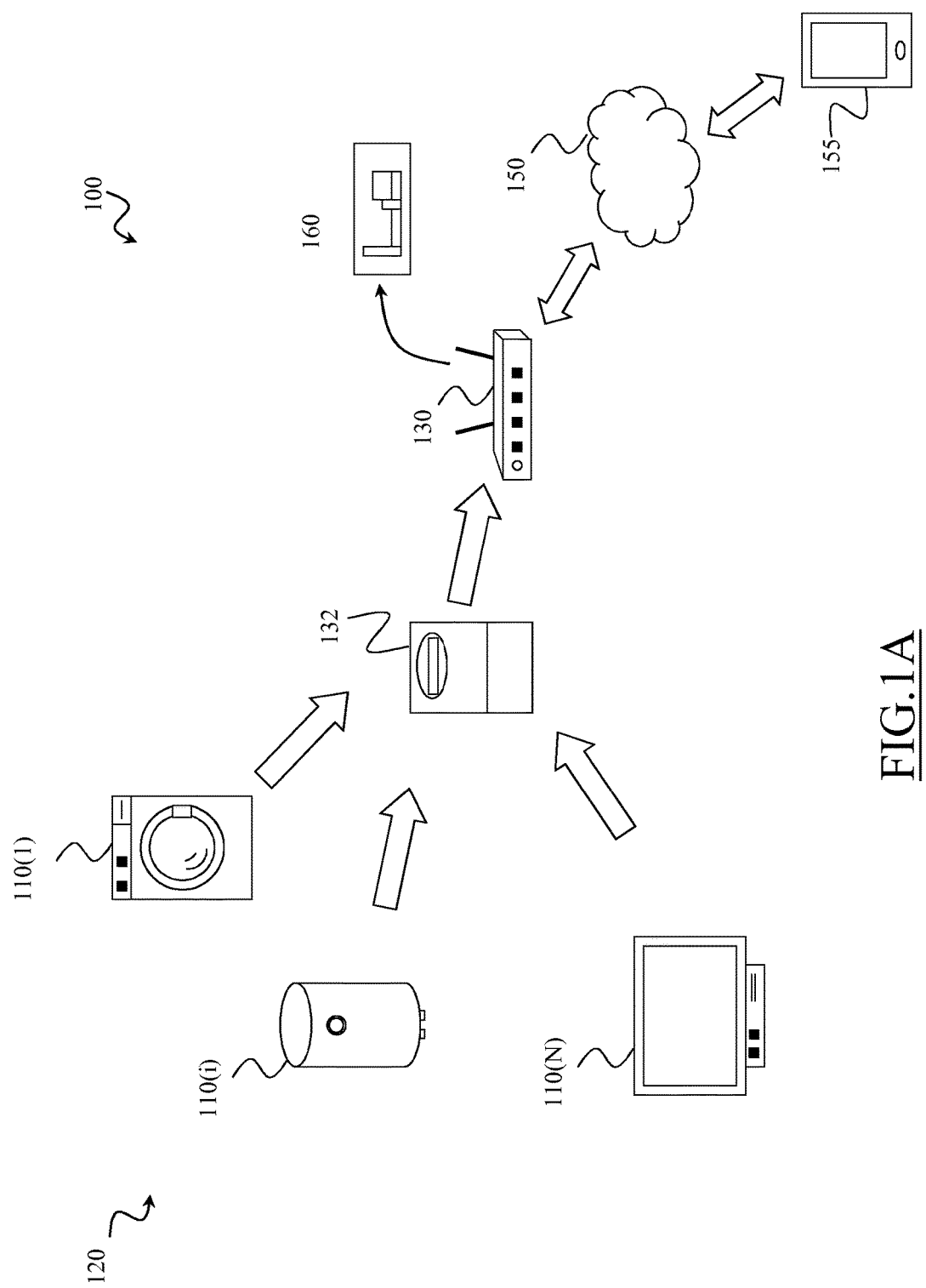
FIG. 1A-1C illustrate exemplary application scenarios in which a system a system for monitoring and controlling house appliances according to an embodiment of the present invention may be applied.
Figure 1B:
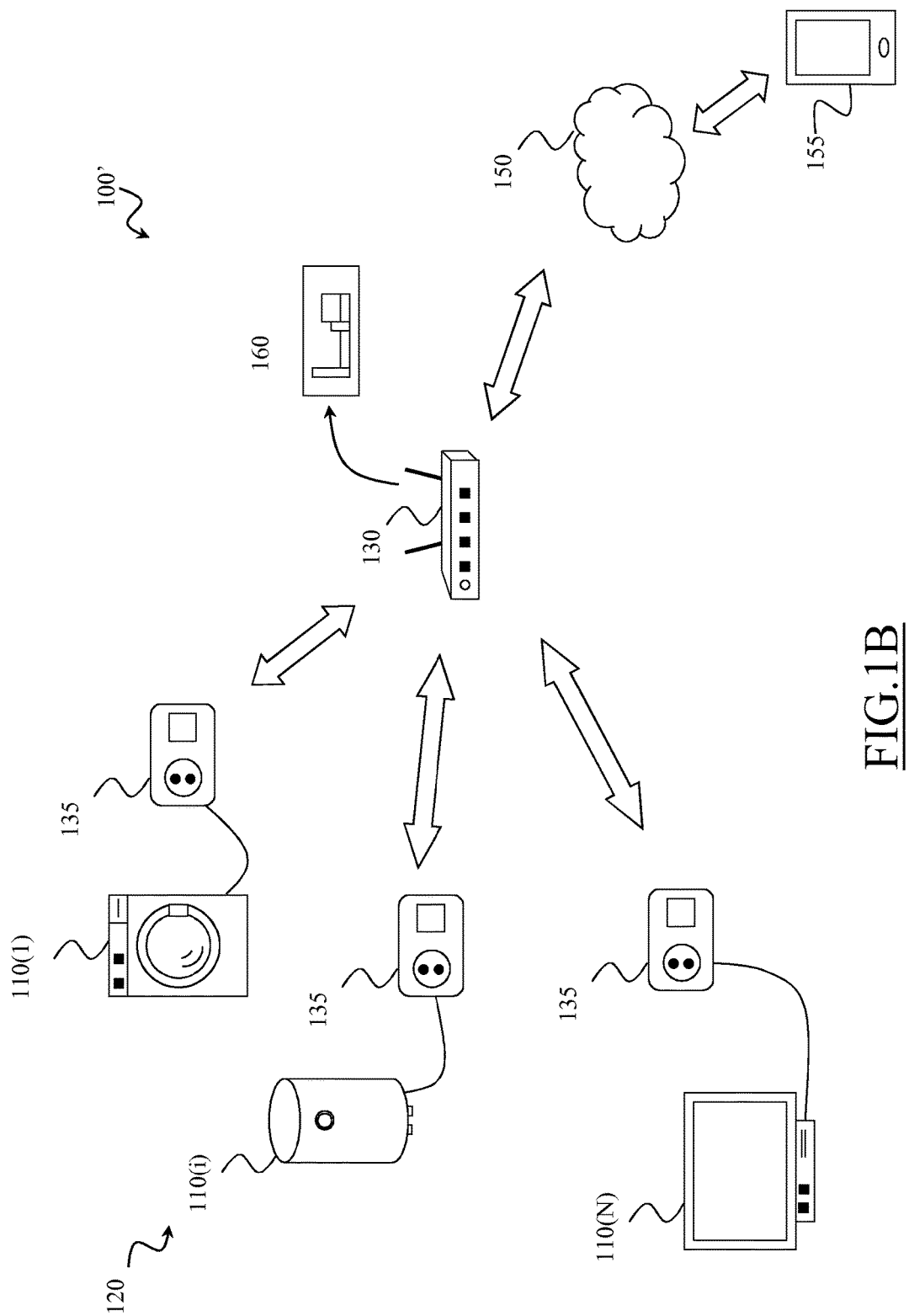
Figure 1C:
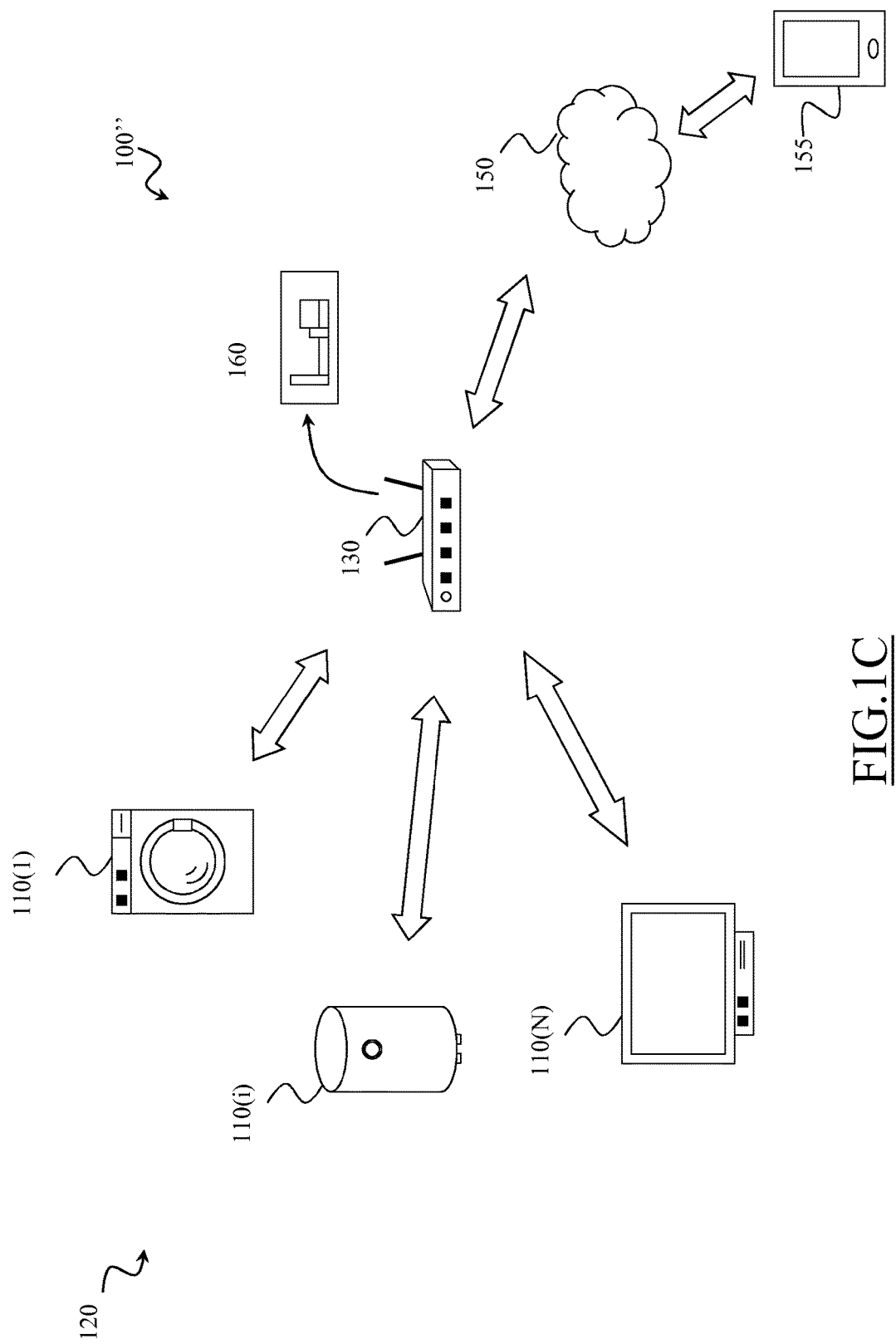

FIGS. 1A-1C depict different exemplary application scenarios in which a system according to an embodiment of the present invention may be applied.

FIG. 1A illustrates a system 100 for monitoring and controlling house appliances 110($i$) ($i$=1 to N) which are supplied by the power line provided by the power grid in a domestic area 120, such as a house, according to an embodiment of the present invention.

A control unit 130 is located in or in the proximity of the domestic area 120 for managing the operation of the system 100 by carrying out a power managing procedure which will be described in detail in the following of the description. For this purpose, according to an embodiment of the present invention the control unit 130 is, e.g., wirelessly, interfaced with the electricity meter 132 located in the domestic area 120 that measures the amount of electric power consumed in such domestic area 120.

The control unit 130 may be located in a hardware processing unit, such as a domestic Wi-Fi station (e.g., an ADSL router), and the power managing procedure may be carried out by running an application and/or a software program locally stored in a memory of such processing unit and/or remotely available, for example through the Internet.

Similar considerations apply if different connections (wired and/or wireless) are exploited. Moreover, the control unit 130 may have another structure, such as a dedicated and/or stand-alone hardware unit, or may comprises similar elements, such as cache memories temporarily storing the software program implementing the managing procedure. Furthermore, the control unit 130 may be also directly integrated within the electricity meter 132.

According to another embodiment of the present invention (not illustrated), the control unit 130 is not located in or in the proximity of the domestic area 120, but instead is a remote control unit which is remotely interfaced with the electricity meter 132, for example through a remote network, such as the Internet, for receiving meter data provided by the electricity meter 132.

According to an embodiment of the present invention, the control unit 130 is configured to carry out known Non-Intrusive Load Monitoring (NILM) procedures, such as the one disclosed in U.S. Pat. No. 4,858,141, adapted to analyze changes in the currents and voltages in the domestic area 120 to deduce which house appliances 110(*i*) are currently active within the domestic area 120, as well to deduce for each house appliance 110(*i*) approximations of a corresponding power profile indicative of the electric power consumed by said house appliance 110(*i*) over time (when turned on).

Based on the appliances' power usage and/or power profiles obtained through the NILM procedure, the power managing procedure executed by the control unit 130 according to an embodiment of the present invention provides for scheduling the operation of the various house appliances 110(*i*) of the domestic area 120 in such a way to efficiently manage the domestic electric power consumption, avoiding the occurrence of overloads and reducing the overall cost by concentrating as much as possible the operations of the house appliances 110(*i*) in the hours of the day wherein the electric power cost is cheapest, respecting at the same time constraints imposed by the operation of the house appliances 110(*i*) and optionally the time preferences set by the user.

For this purpose, according to an embodiment of the present invention, the power managing procedure running on the control unit 130 is configured to generate a time schedule—identified in figure with reference 160—of the house appliances 110(*i*) operations optimized so as to accomplish the abovementioned objectives.

According to an embodiment of the present invention, the control unit 130 is configured to remotely provide the generated time schedules 160 to a, e.g., remote, personal user equipment 155, such as a smartphone or a personal computer, for example through a remote network 150, such as the Internet.

According to an embodiment of the present invention, the user may take advantage of the power consumption optimization suggestions provided by the control unit 130 by manually turning on/off and/or setting the operation of the house appliances 110(*i*) based on the contents of the received time schedule 160.

For this purpose, the user equipment 155 may be provided with proper software, e.g., a dedicated App, adapted to allow a user thereof to directly view the details of the received time schedules 160. According to an embodiment of the present invention, said software may be also configured to provide the user with corresponding reminders automatically generated based on the time schedules 160.

According to another embodiment of the present invention, instead of being carried out by the control unit 130, the power managing procedure may be carried out by the user equipment 155 itself. In this case, the control unit 130 is configured to directly route the data collected by the electricity meter 132 toward the user equipment 155 through the remote network 150.

FIG. 1B illustrates a system 100' for monitoring and controlling house appliances 110(*i*) which are supplied by the power line provided by the power grid in a domestic area 120, such as a house, according to another embodiment of the present invention.

According to said embodiment, the house appliances 110(*i*) are connected to the power grid for receiving the power line through so-called smart plugs 161 equipped with measuring units capable of operating power measurements on the appliance which are connected, communication units adapted to exchange data with the control unit 130 and relay units adapted to control the appliance supply in response to commands received by the control unit 130. Thanks to the presence of the smart plugs 162, the control unit 130 is able to obtain information relating to the power usage of such appliances, and deducing approximate power profiles thereof without having to carry out a NILM procedure.

Thanks to the presence of relay units in the smart plugs 162, the time schedules 160 generated by the control unit 130 according to the power managing procedure may be automatically implemented without the intervention of a user, since each smart plug 162 is capable of turning on/off the supply to the corresponding house appliance 110(*i*) under the control of the control unit 130 itself.

According to another embodiment of the present invention (not illustrated), the control unit 130 of the system 100' is not located in or in the proximity of the domestic area 120, but instead is a remote control unit which is remotely interfaced with the smart plugs 162, for example through a remote network, such as the Internet, by means of a router device, for exchange data and commands.

FIG. 1C illustrates a system 100" for monitoring and controlling house appliances 110(*i*) which are supplied by the power line provided by the power grid in a domestic area 120, such as a house, according to another embodiment of the present invention.

According to said embodiment, each house appliance 110(*i*) is a smart appliance, i.e, an appliance equipped with a communication interface adapted to exchange data with the control unit 130, such as a Wi-Fi interface, a ZigBee interface, or a power-line interface, as well as with the capability of directly providing the control unit 130 with the power profiles of the house appliances 110(*i*), and of being controlled in response to commands received by the control unit 130. By transmitting the power profile of an appliance to the local control unit 130, the latter is thus capable of estimating the power consumption of such appliance.

In this case, the time schedules 160 generated by the control unit 130 according to the power managing procedure are directly provided to the house appliances 110(*i*), which accordingly turn on/off and set their power profiles following the time schedules 160 in an autonomous way, without the intervention of a user.

According to another embodiment of the present invention (not illustrated), the control unit 130 of the system 100" is not located in or in the proximity of the domestic area 120, but instead is a remote control unit which is remotely interfaced with the house appliances 110(*i*), for example through a remote network, such as the Internet, for exchange data and commands.

As for the system 100 illustrated in FIG. 1A, according to an embodiment of the invention, the system 100' of FIG. 1B and the system 100" of FIG. 1C may have the control unit 130 that is also configured to remotely provide the generated time schedules 160 to the remote personal user equipment 155, to allow users thereof to directly view the details of the received time schedules 160, and/or to provide the user with reminders automatically generated based on the time schedules 160.

Although in the examples considered in FIGS. 1A, 1B and 1C the systems 100, 100', 100" are configured to monitor and control house appliances located in a house, the proposed system 100, 100', 100" may be configured to monitor and control house appliances of an entire district, appliances located in a commercial area, as well as devices of industrial areas, such as electric equipment located in an industrial plant.

As will be described in detail in the following of the present description, the time schedule 160 is generated by properly scheduling the start time of all the power profiles of the appliances 110(*i*), taking into account time and power constraints. The power managing procedure further provides for dynamically and rapidly updating said time schedule 160 in response to any possible unforeseeable or disruptive event, such as the direct request of activating a specific house appliance 110(*i*) by an user, the variation of the electric power cost due to a dynamic variation of the daily tariff profile, a possible imminent overload occurrence, the variation of electric power amount generated by photovoltaic solar panels as a result of cloud cover change and so on, so as to adapt the domestic electric power consumption in order to avoid the occurrences of overloads and reduce the costs.

Figure 2:
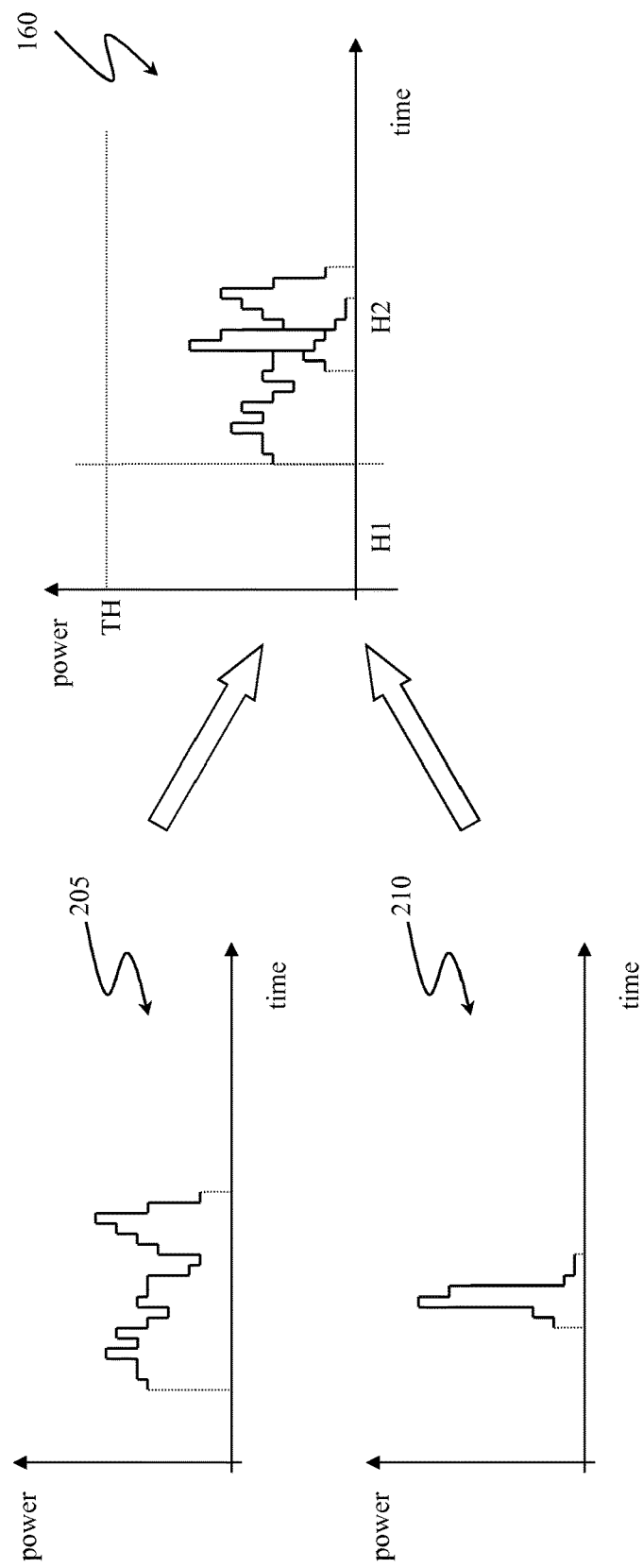
FIG. 2 illustrates an example of a time schedule of the house appliances generated by the system of FIG. 1A according to an embodiment of the present invention.

In order to illustrate how a possible time schedule 160 is structured according to an embodiment of the present invention, reference is made to the example of FIG. 2. In this example, there is a first time slot H1 (e.g, the time slot corresponding to the office hours of a day) corresponding to a first electric power cost and a second time slot H2 (e.g., the time slot corresponding to the remaining hours of the day) corresponding to a second electric power cost lower than the first one. Moreover, in this very simplified example a first appliance 110(*i*) has a corresponding first power profile 205, and a second appliance 110(*i*) has a corresponding second power profile 210. Each power profile 205, 210 is indicative of the electric power consumed by the corresponding house appliance 110(*i*) over time when the latter is activated. The shape and the duration of the power profiles strongly depend on the type of appliance 110(*i*), as well as on the way the appliance 110(*i*) is operated.

The exemplary time schedule 160 is generated by distributing over time the power profiles 205 and 210—i.e., by selecting the start times of each one of them—in such a way that at any time the total power consumption is kept under the maximum power threshold TH of the power grid, so as to avoid any overload occurrence, and that the highest power consumptions preferably occur in the cheaper second time slot H2. The need of avoiding overload occurrences is one of possible power constraints affecting a scheduling, while the preference of concentrating the highest power consumptions in the cheapest hours of the day is one of possible time constraints affecting a scheduling.

In real actual cases, the appliances 110(*i*) located in the domestic area 120 are numerous, each one provided with complicated power profiles, which may be linked together by means of complicated time constrains. Consequently, generating optimized time schedules 160 is a very complex task, which is difficult to be accomplished. When the number of variables at stake is very high, it is nearly impossible to obtain the "overall best" time schedule in almost real time and without high computation capabilities (such as in the case of a system to be installed in a domestic area). Indeed, the generation of optimized time schedule can be classified as a "Resource Constrained Scheduling Problem", which is known as being an NP-hard combinatorial optimization problem. The systems 100, 100', 100" according to the embodiments of the present invention are instead directed to calculate in relatively short times optimized time schedules 160 which have the quality of ones among the best time schedules, without the need of high computation capabilities. The quality of a time schedule 160 may be quantified by a corresponding cost function formed by a sum of penalty components each one measuring how a respective one of the abovementioned constraints has been violated by running the appliances 110(*i*) according to said time schedule 160. The better a constraint is respected, the lower its corresponding penalty component. Therefore, with the same conditions, a time schedule having a corresponding cost function value is considered to have a higher quality than other time schedules having higher cost function values.

Figure 3:
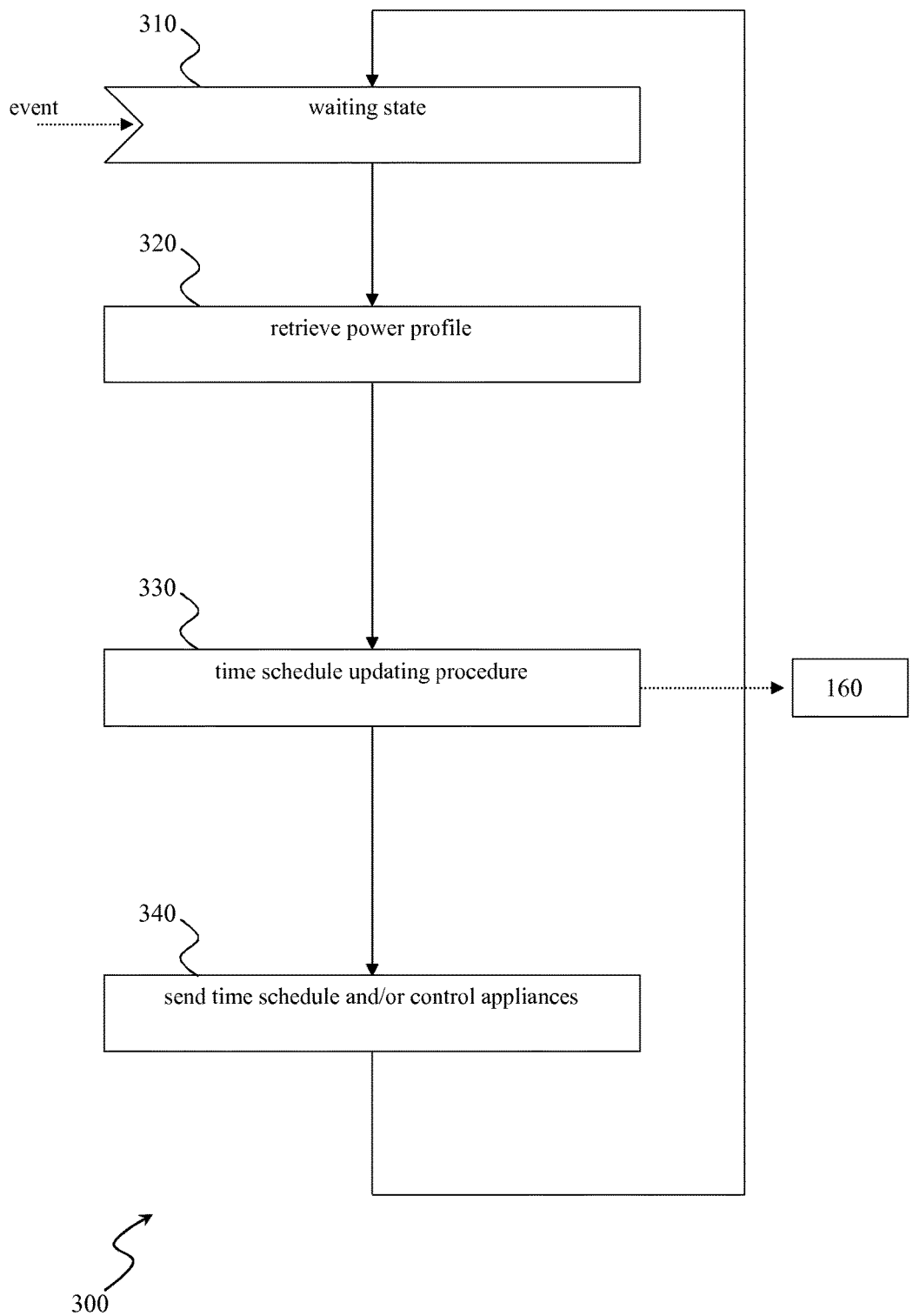
FIG. 3 illustrates in terms of functional blocks the main operations of a power managing procedure carried out by a control unit of the system according to an embodiment of the present invention.

FIG. 3 illustrates in terms of functional blocks the main operations of the power managing procedure (identified in figure with reference 300) which is adapted to be carried out by the control unit 130 for controlling the appliances 110(*i*) of the system 100 according to an embodiment of the present invention.

The control unit 130 is configured to be constantly active, remaining in a waiting state ready to respond to any possible event requiring a new scheduling (block 310). Such event may be a direct request of activating a specific house appliance 110(*i*) by the user, the expiration of a predetermined time period, or a generic condition variation, such as an unplanned overload occurrence.

In response to such events, the control unit 130 reacts by collecting the power profile(s) of the required house appliances 110(*i*) (block 320). For example, in case the user sends a request of activating a selected house appliance 110(*i*), the control unit 130 collects the power profile of such specific house appliance 110(*i*). The power profiles of the house appliances 110(*i*) are obtained in the ways previously described, i.e., they are deduced by means of a NILM procedure, through a smart plug, or directly provided by the house appliances 110(*i*), if the latters are of the smart-type. According to another embodiment of the invention, instead of transmitting the power profile of an appliance 110(*i*) every time the appliance 110(*i*) is requested to be activated by a user, the power profiles of all the appliances 110(*i*) are already stored in a local or remote database (not illustrated), which can be accessed by the control unit 130. In any case, if the triggering event is a time period expiration or a condition variation, the control unit 130 does not require any new power profile, and the operations of block 320 may be skipped.

At this point, as will be described in greater detail in the following of the description, the control unit 130 performs a time schedule updating procedure (block 330), whose output is an updated version (i.e., which takes into account the event occurrence) of the time schedule 160, taking into account also the newly received data (if present). It has to be noted that the first time the power managing procedure 300 is carried out, e.g., the first time a user requests the activation of an appliance 110(*i*), or in case the triggering event has occurred after that all possible previously scheduled appliance operations have already terminated, the time schedule 160 to be updated will be a blank time schedule.

Then, the control unit 130 sends the details of the updated time schedule 160 to the personal user equipment 155—so as to allow the user of the latter to manually turn on/off and/or set the operation of the house appliances 110(*i*) based on the contents of the received time schedule 160—and/or directly controls the house appliances 110(*i*) based on the updated time schedule 160 if the house appliances 110(*i*) are connected to smart plugs provided with relay units, or if the house appliances 110(*i*) are smart appliances (block 340). For example, in case the house appliances 110(*i*) are smart appliances, each appliance 110(*i*) is provided with data relating to the portions of the updated time schedule 160 which concern the execution of the power profile of such appliance 110(*i*), so that the appliance automatically adapts and synchronizes its operation based on the received data. If instead the appliance 110(*i*) is a standard "non-smart" appliance, but is connected to the power grid through a smart plug 135, the relay unit of the smart plug 135 is configured to control the appliance supply based on the received data.

According to an embodiment of the present invention, the time schedule updating procedure 330 is based on a swarm optimization approach. A known swarm optimization approach is disclosed for example in "*Particle Swarm Optimization*" by James Kennedy and Russel Eberhart, Neural Networks, 1995. Proceedings., IEEE International Conference on (Volume:4), ISBN 0-7803-2768-3. The swarm approach is a population-based metaheuristic algorithm, which has been inspired by swarm intelligence of animal behavior. Briefly, according to the present invention, the time schedule updating procedure 330 provides for randomly generating a population, hence referred to as "swarm", of candidate solutions (i.e., candidate time schedules), referred to as "particles of the swarm", and then moving these particles in the search space comprising a set of the possible time schedules. Each particle of the swarm is represented by a corresponding D-dimensional array, wherein D is the number of the household appliances 110(i), and each i-th value of the D-dimensional array specifies the start time of the power profile of a corresponding i-th household appliance 110(i).

According to an embodiment of the present invention, the motion of the particles is further based on a "nature-inspired evolutionary flight," i.e., it follows a random walk based on a nature-inspired fractal evolution that has been identified also in natural phenomena and higher order animal behavior.

A random walk is a series of consecutive random steps starting from an origin position. In a random walk, the next position only depends on the current position and on the next step. The next step is calculated based on a random number drawn from a certain probability distribution. In case such probability distribution is the Gaussian distribution, the random walk becomes the Brownian motion.

According to an embodiment of the present invention, the particles of the swarm are of two different types, each one following a different movement strategy according to a respective different type of random walk.

According to an embodiment of the present invention, the generic particle of the first type, hereinafter identified as P1, is configured to patrol over relatively long distances within the search space, following a random walk based on a Lévy probability distribution. Lévy probability distribution is a probability distribution both stable and heavy-tailed. A stable distribution is such that any sum of n random numbers drawn from the distribution is finite and can be expressed as $$\sum_{i=1}^{n} x_i = n^{1/\alpha} x,$$

where x represents a random number having the same distribution and α, called "index of stability", controls the shape of the distribution probability (0<α≤2). A heavy-tailed distribution has an infinite variance decaying at large x to $\lambda(x) \sim |x|^{-1-\alpha}$. Due to the stable property, a random walk following the Lévy distribution will cover a finite distance from its original position after any number of steps. But also due to the heavy tail (divergence of the variance), extremely long jumps may occur and typical trajectories are self-similar, on all scales showing clusters of shorter steps interspersed by long excursions.

Lévy distributions are for example disclosed in *Introduction to the theory of Lévy flights*, by A. V. Chechkin, R. Metzler, J. Klafter, and V. Yu. Gonchar.

According to an embodiment of the present invention, the generic particle of the second type, hereinafter identified as P2, is instead configured to remain close to its current position, following a local uniform random walk which provides for performing random steps whose amplitude is related to the diameter of the swarm. Unlike the particles P1 of the first type, the particles P2 of the second type follow a random walk based on a probability distribution having a finite variance.

In other words, while the particles P1 of the first type have an "explorative" behavior, which drives them to globally search within the search space, the particles P2 of the second type have an "intensive" behavior, which drives them to locally search within the search space.

Figure 4A:
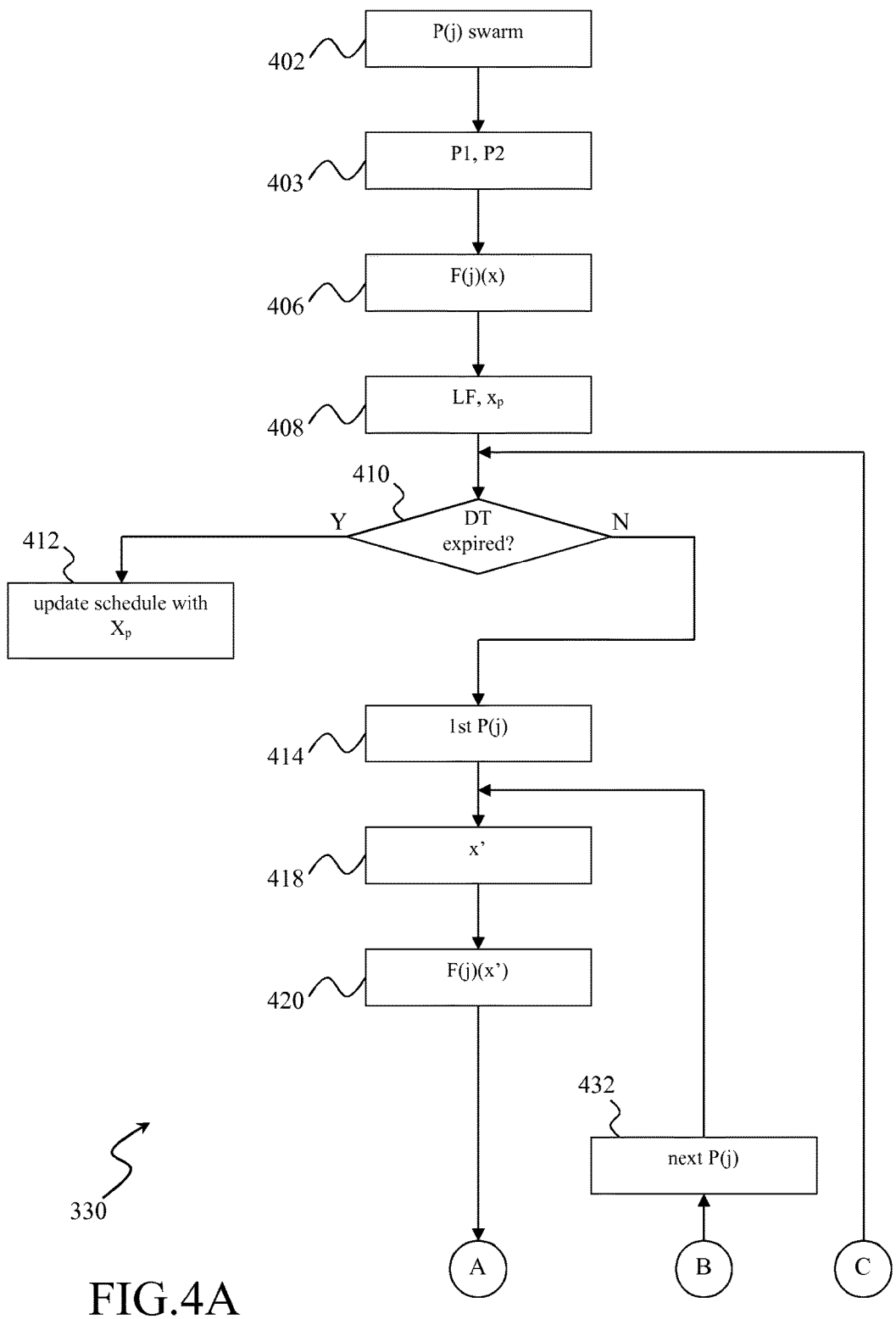
FIGS. 4A-4B illustrate in terms of functional blocks a time schedule updating procedure of the power managing procedure of FIG. 3 according to an embodiment of the present invention.
Figure 4B:
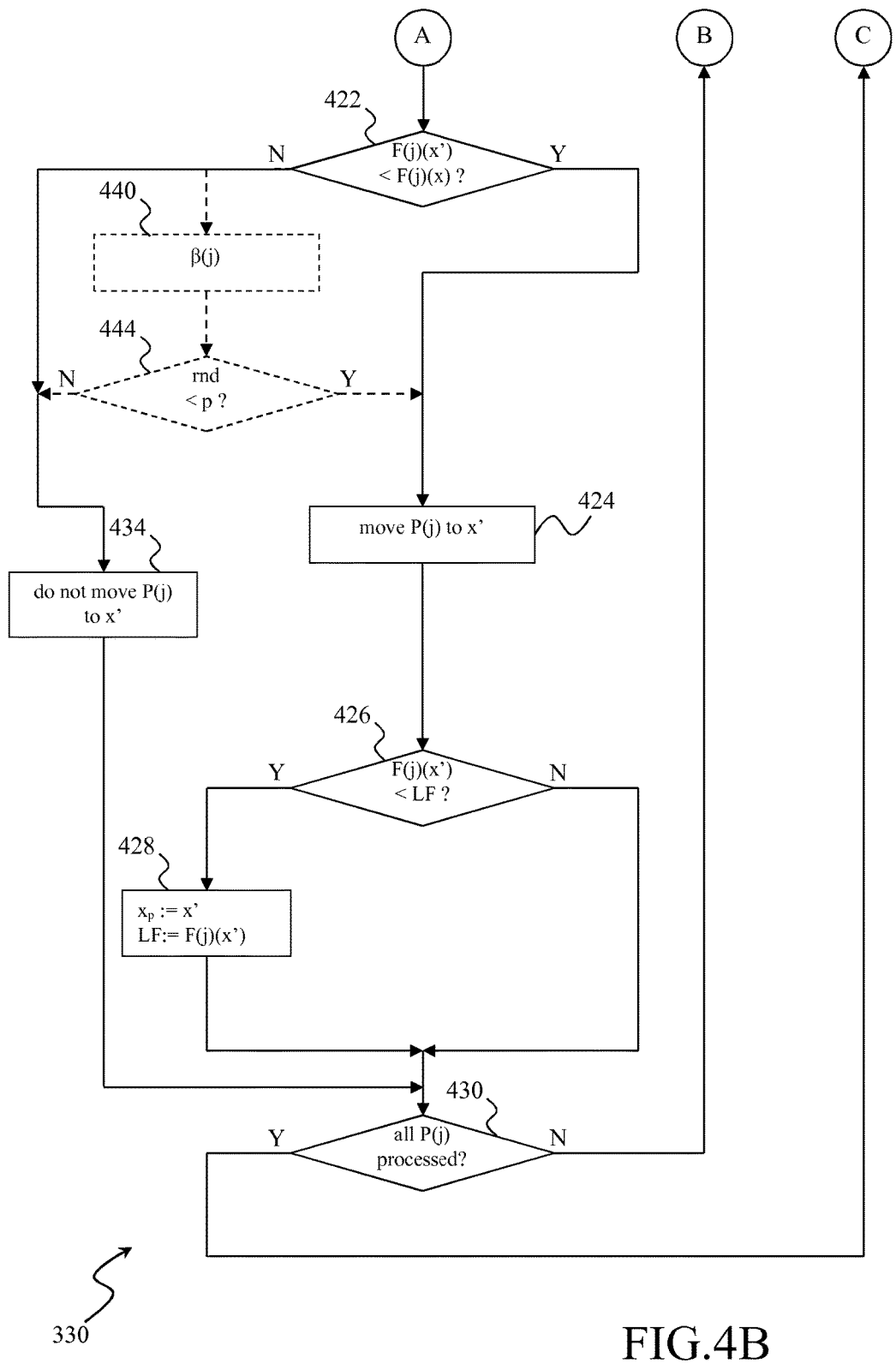

FIGS. 4A-4B illustrates in terms of functional blocks the time schedule updating procedure 330 according to an embodiment of the present invention.

In a first phase of the updating procedure (block 404), the control unit 130 creates the swarm by generating M particles P(j) (j=1 to M) and positioning them randomly in a search space X of a set of the possible solutions (time schedules) x. In the foregoing the "search space" should be construed as the temporal domain in a time period ahead of present time. Hereinafter, the generic solution x corresponding to a generic position of a particle P(j) in the search space X will be also simply referred to as "position". The number M of particles of the swarm affects both the outcome and the computational cost of the procedure. A large number of particles provide for a broader search, but at the same time updating too many particles may reduce the convergence of the algorithm that needs to focus the search in the whereabouts of the most promising spots so as to find good solutions in relatively short time. For example, a good compromise may provide for setting M to a value comprised in the interval [10-40].

The next phase of the updating procedure is to subdivide the M particles P(j) of the swarm in a first group of particles P1 of the first type and in a second group of particles P2 of the second type (block 403). According to an embodiment of the present invention, the ratio between the number of particles P1 of the first group and the number of particles P2 of the second group is set to about 50%.

Then, the control unit 130 calculates for each particle P(j) of the swarm a corresponding cost function F(j)(x) of the solution x corresponding to the current position of said particle (block 406). Said cost function F(j)(x) applies to both the particles P1 of the first group and the particles P2 of the second group.

For this purpose, according to an embodiment of the present invention the control unit 130 calculates an overload penalty O(x) that measures how much the overload constraint is violated by using solution x, and then sets the cost function F(j)(x) to w1*O(x), wherein w1 is a weight coefficient, for example on the order of $10^9$ (block 406). According to an embodiment of the invention, the overload penalty may be equal to 0 for the solutions x in which the overload is totally avoided (i.e., when the total power consumption is kept under the maximum power threshold TH of the power grid), while it is higher than 0 for the solutions x corresponding to an overload occurrences (e.g., with the value of O(x) that increases as the total power consumption departs from the maximum power threshold TH). According to a further embodiment of the present invention, instead of calculating a cost function F(j)(x) which depends on the overload penalty only O(x), the control unit 130 is further configured to calculate an energy cost penalty C(x) that measures how much the electric energy would cost using the solution x based on the daily tariff profile known in advance, and to accordingly set the cost function F(j)(x) to w1*O(x)+ w2*C(x), wherein w2 is a weight coefficient that may be of the order of 1. In any case, the weight coefficient w1 of the overload penalty O(x) is advantageously set much higher than the weight coefficient w2 of the energy cost penalty C(x), so as to provide the overload constraint with the highest priority.

Afterward, the control unit 130 compares the just calculated cost functions F(j)(x) to each other to find the one having the lowest value, simply referred to as lowest cost function value LF (block 408). The position x of the particle P(j) corresponding to said lowest cost function value LF—hereinafter referred to as best position $x_b$—is elected as the best solution (i.e., the best time schedule 160) so far taken by any particle P(j) of the swarm.

Then, the control unit 130 checks whether a deadline time DT is expired or not (block 410) from the beginning of the time schedule updating procedure 330.

If the deadline time DT has expired (exit branch Y of block 410), the time schedule updating procedure 330 is terminated, and the current time schedule 160 is updated with the time schedule corresponding to the best solution $x_p$ in the search space (block 412).

If the deadline time DT has not yet expired (exit branch N of block 410), the swarm arrangement is changed by moving the M particles P(j) thereof in the search space according to a swarm flight procedure according to an embodiment of the present invention which is described below.

The control unit 130 selects a first particle P(j) of the swarm (block 414) and performs the following operations corresponding to blocks 418-428 and 434, 440, 444 on said particle P(j).

The control unit 130 calculates a candidate new position x' for the selected particle P(j) (block 418). According to an embodiment of the present invention, the way the candidate new position x' is calculated depends on the type of particle P(j), i.e., it depends on whether the particle P(j) corresponds to a particle P1 of the first type or to a particle P2 of the second type.

According to an embodiment of the present invention, if the selected particle P(j) corresponds to a particle P1 of the first type, the candidate new position x' for the particle P(j) is set to:

$$x'=x+b\cdot(x_b-x)\cdot c(\alpha),$$

wherein x is the previous position of the particle P(j), b is a positive coefficient higher than zero, referred to as the constriction coefficient, which controls the step size of the jump from the previous position x of the particle P(j), $c(\alpha)$ is a random number with Lévy distribution, and $x_b$ is the best position so far taken by any particle P(j) of the swarm. According to an embodiment of the invention, the constriction coefficient b may be set by taking into account the length scale L of the problem of interest. From the theory of isotropic random walks, the distance traveled after g steps in a D dimensional search space (in the case at issue, D is the number of the household appliances 110(i)) is $d=b\cdot\sqrt{g\cdot D}$. As a rule of thumb, for a length scale L of a dimension of interest, the local search is typically reasonably limited in the region L/10, i.e., D=L/10, which means that the constriction coefficient b may be of the order of $0.1 \cdot L/\sqrt{g\cdot D}$. While D and g are inputs of the power managing procedure 300, the length scale L is estimated according to the following relationship:

$$L = \sqrt{\sum_{x=1}^{D}(\max_{1\le i\le M} X^0_{xi} - \min_{1\le j\le M} X^0_{xj})^2}$$

wherein $(X^0_{i1}, \ldots, X^0_{iD})$ is the position vector of a i-th particle of the swarm in the search space. According to an embodiment of the present invention, the index of stability $\alpha$ of the Lévy distribution is advantageously set to 1.5.

According to an embodiment of the present invention, if the selected particle P(j) is a particle P2 of the second type, the candidate new position x' for the particle P(j) is set to:

$$x'=x+b\cdot(x_n-x_m)\cdot d,$$

wherein b is the same constriction coefficient used for the particles P1 of the first type, d is a random number taken from a uniform distribution in [0,1], and $x_n$ and $x_m$ are the current positions of two randomly selected particles P(n), P(m) of the swarm.

At this point, the control unit 130 calculates the value of the cost function F(j)(x') of the particle P(j) corresponding to the just calculated candidate new position x' (block 420). The value of the cost function F(j)(x') is calculated as described in block 406, i.e., by setting F(j)(x') to w1*O(x) or to w1*O(x)+w2*C(x). Herein, w1 is the weight coefficient, for example on the order of $10^9$ and w2 is the weight coefficient that may be of the order of 1.

The control unit 130 compares the value of the cost function F(j)(x') corresponding to the candidate new position x' of the particle P(j) with the value of the cost function F(j)(x) corresponding to the actual position x of the particle P(j) (block 422).

If the value of the cost function F(j)(x') corresponding to the candidate new position x' of the particle P(j) is lower than the value of the cost function F(j)(x) corresponding to the actual position x of the particle P(j) (exit branch Y of block 422), it means that the just calculated candidate new position x' corresponds to a better solution compared to the actual one. Therefore, the particle P(j) is actually moved in the search space X to the candidate new position x' (block 424).

After that the particle P(j) has been moved to the new position x', a check is made to assess whether the corresponding value of the cost function F(j)(x') is lower than the lowest cost function value LF or not (block 426).

In the affirmative case (exit branch Y of block 426), said new position x' is elected as the new best solution $x_b$ (i.e., the best time schedule 160) so far taken by any particle P(j) of the swarm, and the lowest cost function value LF is set to the cost function F(j)(x') value (block 428).

In the negative case (exit branch N of block 426) the lowest cost function value LF and the corresponding best solution $x_b$ are left unchanged.

At this point, the control unit 130 checks whether all the particles P(j) of the swarm have been processed or not (block 430).

If there are other particles P(j) left to be processed (exit branch N of block 430), the control unit 130 selects a next particle P(j) of the swarm (block 432) and reiterates the operation previously described for said new particle P(j) (return to block 418).

If instead the particle P(j) is the last particle of the swarm (exit branch Y of block 430), the procedure returns to block 410.

Returning to the decision block 422, if the value of the cost function F(j)(x') corresponding to the candidate new position x' of the particle P(j) is not lower than the value of the cost function F(j)(x) corresponding to the actual position x of the particle P(j), it means that the just calculated candidate new position x' corresponds to a worse solution compared to the current one.

In this case, according to an embodiment of the present invention (continuous-line exit branch N of block 422), the candidate new position x' is discarded, and the particle P(j) is not moved (block 434). Then, the procedure proceeds to block 430, in order to check whether all the particles P(j) of the swarm have been processed or not.

According to another embodiment of the present invention (dashed-line exit branch N of block 422), even if the value of the cost function F(j)(x') corresponding to the candidate new position x' of the particle P(j) is not lower than the value of the cost function F(j)(x) corresponding to the actual position x of the particle P(j), a probability exists to move anyway the particle P(j) to the candidate new position x', in order to allow a better exploration of the search space X even in peripheral portions thereof far away from the zones wherein the other particles P(j) tend to converge.

For this purpose, according to an embodiment of the present invention, the control unit 130 calculates a so-called "relative attractiveness" parameter β(j) of the particle P(j) (block 440) using the following ratio:

$$\beta(j) = \frac{F(j)(x') - LF}{\|x' - x_p\|_2}$$

wherein the numerator corresponds to the difference between the value of the cost function F(j)(x') corresponding to the candidate new position x' and the lowest cost function value LF of the swarm, and the denominator corresponds to the Euclidean distance between the candidate new position x' and the best solution $x_b$ so far taken by any particle P(j) of the swarm. Based on the relative attractiveness parameter β(j), the control unit 130 calculates a probability threshold p using the following Boltzmann formula:

$$p \approx e^{-\gamma \cdot \beta(j) \cdot \frac{maxd}{F(j)(x')}}$$

wherein max d is the distance of the furthest particle P(j) from the best solution $x_b$, and γ is a normalization parameter. The threshold p corresponds to the probability of choosing to move anyway the particle P(j) to the candidate new position x' even if said candidate new position x' corresponds to a worse solution (i.e., to a higher cost function F(j)(x') value). The normalization parameter γ is a positive number. For the same conditions, the higher the normalization parameter γ, the lower the probability threshold p. According to an embodiment of the present invention, the normalization parameter γ is preferably chosen among the interval [$10^{-3}$, $10^3$].

According to an embodiment of the present invention, the control unit 130 draws a random number rnd belonging to the interval [0,1] and compares it with the probability p previously calculated. If said number rnd is lower than p (exit branch Y of block 444), the particle P(j) is moved to the candidate new position x' (proceed to block 424); if said number rnd is instead higher than p (exit branch N of block 444), the particle P(j) is not moved (proceed to block 434).

The deadline time DT used in block 410 to determine the time schedule updating procedure 330 duration is set in such a way to allow the operations corresponding to blocks from 414 to 444 that are carried out on all the M particles P(j) of the swarm to be repeated for a substantial high number of new swarm arrangements. Generally, the higher the deadline time DT, the lower the cost function LF corresponding to the best solution $x_p$. However, a long deadline time DT may reduce the time schedule 160 updating responsiveness to possible occurring events.

The previous description presents and discusses in detail several embodiments of the present invention; nevertheless, several changes to the described embodiments, as well as different invention embodiments are possible, without departing from the scope defined by the appended claims.

The invention claimed is:

1. A system for managing devices supplied through a power grid, each device being configured to consume over time electric power according to at least one respective power profile when operating, the system comprising at least one unit interfaced with the devices for exchanging data, the at least one unit being configured to:
   collect power profile data indicative of the power profiles of said devices;
   generate a time schedule of the device operations by distributing over time start times of the power profiles in such a way that at any time the total power consumption of the devices is kept under a maximum power threshold of the power grid, wherein:
   the at least one unit is configured to generate said time schedule through a particle swarm optimization approach by:
   a) randomly generating a population of candidate time schedules within a search space comprising a set of the possible candidate time schedules;
   b) subdividing the population of candidate time schedules in a first group of candidate time schedules and in a second group of candidate time schedules;
   c) performing phases d) and e) at least once;
   d) moving the candidate time schedules of the first group in the search space following a random walk based on a stable probability distribution having an infinite variance;
   e) moving the candidate time schedules of the second group in the search space following a random walk based on a probability distribution having a finite variance;
   f) selecting a candidate time schedule based on a cost of said candidate time schedule corresponding to its position in the search space calculated by means of a cost function.

2. The system of claim 1, wherein:
   said random walk based on a stable probability distribution having an infinite variance is a random walk based on a Lévy probability distribution, and
   said random walk based on a probability distribution having a finite variance is a uniform random walk.

3. The system of claim 1, wherein the at least one unit is further configured to:
   for each candidate time schedule of the first and the second groups, moving said candidate time schedule by:
   a) calculating a corresponding new position in the search space for said candidate time schedule,
   b) moving said candidate time schedule to the corresponding new position conditioned to a comparison between a cost of said candidate time schedule corresponding to the current position in the search space calculated by means of the cost function and a cost of said candidate time schedule corresponding to the new position in the search space calculated by means of the cost function.

4. The system of claim 3, wherein the at least one unit is further configured to:
select a candidate time schedule best position in the search space among positions previously taken by all the candidate time schedules in the search space based on the cost thereof, and
move each candidate time schedule by:
if the candidate time schedule belongs to the first group, calculating said corresponding new position based on a first difference between the best position and the current position of the candidate time schedule;
if the candidate time schedule belongs to the second group, calculating said corresponding new position based on a second difference between the current positions of two random candidate time schedules of the population.

5. The system of claim 4, wherein the at least one unit is further configured to move each candidate time schedule by:
if the candidate time schedule belongs to the first group, calculating said corresponding new position by varying the current position thereof by a first term based on a product between said first difference and a random number with Lévy distribution;
if the candidate time schedule belongs to the second group, calculating said corresponding new position by varying the current position thereof by a second term based on a product between said second difference and a random number with a uniform distribution.

6. The system of claim 4, wherein the at least one unit is further configured to move said candidate time schedule to the corresponding new position if the cost of the candidate time schedule corresponding to the current position is higher than the cost of the candidate time schedule corresponding to the new position.

7. The system of claim 6, wherein the at least one unit is further configured to move said candidate time schedule to the corresponding new position when the cost of the candidate time schedule corresponding to the current position is lower than the cost of the candidate time schedule corresponding to the new position conditioned to a parameter corresponding to a ratio of a third term and a fourth term, the third term corresponding to the difference between the cost of the candidate time schedule corresponding to the new position and the cost of the candidate time schedule in the candidate time schedule best position, the fourth term corresponding to the distance between the new position and the candidate time schedule best position.

8. The system of claim 1, wherein the cost function of a candidate time schedule depends on the difference between the maximum power threshold of the power grid and a power consumption of the devices that would occur if the devices operated following the candidate time schedule.

9. The system of claim 1, wherein the at least one unit comprises a control unit configured to automatically control the operation of the devices based on the time schedule.

10. The system of claim 1, wherein the at least one unit comprises a user equipment configured to allow a user to view details of the time schedule.

11. A method for managing devices supplied through a power grid, each device being configured to consume over time electric power according to at least one respective power profile when operating, the method comprising:

collecting power profile data indicative of the power profiles of said devices;
generating a time schedule of the device operations by distributing over time start times of the power profiles in such a way that at any time the total power consumption of the devices is kept under a maximum power threshold of the power grid, wherein said generating a time schedule comprises generating said time schedule through a swarm optimization approach by performing the following phases:
a) randomly generating a population of candidate time schedules within a search space comprising a set of the possible candidate time schedules;
b) subdividing the population of candidate time schedules in a first group of candidate time schedules and in a second group of candidate time schedules;
c) performing phases d) and e) at least once;
d) moving the candidate time schedules of the first group in the search space following a random walk based on a stable probability distribution having an infinite variance;
e) moving the candidate time schedules of the second group in the search space following a random walk based on a probability distribution having a finite variance;
f) selecting a candidate time schedule based on a cost of said candidate time schedule corresponding to its position in the search space calculated by means of a cost function.

12. The method of claim 11, wherein:
said random walk based on a stable probability distribution having an infinite variance is a random walk based on a Lévy probability distribution, and
said random walk based on a probability distribution having a finite variance is a uniform random walk.

13. The method of claim 11, wherein the method further comprises:
for each candidate time schedule of the first and the second groups, moving said candidate time schedule by:
a) calculating a corresponding new position in the search space for said candidate time schedule,
b) moving said candidate time schedule to the corresponding new position conditioned to a comparison between a cost of said candidate time schedule corresponding to the current position in the search space calculated by means of the cost function and a cost of said candidate time schedule corresponding to the new position in the search space calculated by means of the cost function.

14. The method of claim 13, wherein the method further comprises:
selecting a candidate time schedule best position in the search space among positions previously taken by all the candidate time schedules in the search space based on the cost thereof, and
moving each candidate time schedule by:
if the candidate time schedule belongs to the first group, calculating said corresponding new position based on a first difference between the best position and the current position of the candidate time schedule;
if the candidate time schedule belongs to the second group, calculating said corresponding new position based on a second difference between the current positions of two random candidate time schedules of the population.

15. The method of claim 14, wherein the phase of moving each candidate time schedule comprises:

if the candidate time schedule belongs to the first group, calculating said corresponding new position by varying the current position thereof by a first term based on a product between said first difference and a random number with Lévy distribution;

if the candidate time schedule belongs to the second group, calculating said corresponding new position by varying the current position thereof by a second term based on a product between said second difference and a random number with a uniform distribution.

16. The method of claim 14, further comprising moving said candidate time schedule to the corresponding new position if the cost of the candidate time schedule corresponding to the current position is higher than the cost of the candidate time schedule corresponding to the new position.

17. The method of claim 16, further comprising moving said candidate time schedule to the corresponding new position when the cost of the candidate time schedule corresponding to the current position is lower than the cost of the candidate time schedule corresponding to the new position conditioned to a parameter corresponding to a ratio of a third term and a fourth term, the third term corresponding to the difference between the cost of the candidate time schedule corresponding to the new position and the cost of the candidate time schedule in the candidate time schedule best position, the fourth term corresponding to the distance between the new position and the candidate time schedule best position.

18. The method of claim 11, wherein the cost function of a candidate time schedule depends on the difference between the maximum power threshold of the power grid and a power consumption of the devices that would occur if the devices operated following the candidate time schedule.

19. The method of claim 11, further comprising automatically controlling the operation of the devices based on the time schedule.

20. The method of claim 11, further comprising providing a user with details of the time schedule.

\* \* \* \* \*